US007825024B2

(12) United States Patent
Lin et al.

(10) Patent No.: US 7,825,024 B2
(45) Date of Patent: Nov. 2, 2010

(54) METHOD OF FORMING THROUGH-SILICON VIAS

(75) Inventors: Chuan-Yi Lin, Hsin-Chu (TW);
Song-Bor Lee, Zhubei (TW);
Ching-Kun Huang, Chubei (TW);
Sheng-Yuan Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/277,829

(22) Filed: Nov. 25, 2008

(65) Prior Publication Data

US 2010/0130003 A1 May 27, 2010

(51) Int. Cl.
*H01L 21/4763* (2006.01)
(52) U.S. Cl. .................. 438/637; 257/621; 257/774; 257/E21.597; 257/E23.174; 438/584
(58) Field of Classification Search .................. None
See application file for complete search history.

(56) References Cited

U.S. PATENT DOCUMENTS 7,402,903 B2 * 7/2008 Matsuo .................. 257/698
7,564,115 B2 * 7/2009 Chen et al. .............. 257/508
7,626,257 B2 * 12/2009 Knorr .................... 257/698
2005/0003650 A1   1/2005 Ramanathan et al.
2009/0121321 A1 * 5/2009 Miccoli et al. ........... 257/618
2009/0315154 A1 * 12/2009 Kirby et al. .............. 257/621

OTHER PUBLICATIONS

Zhang, Y., et al., "Fast Copper Plating Process for TSV Fill," International Microsystems, Packaging, Assembly and Circuits Technology, Oct. 13, 2007, pp. 219-222.

* cited by examiner

*Primary Examiner*—Thanh V Pham
*Assistant Examiner*—Andres Munoz
(74) *Attorney, Agent, or Firm*—Slater & Matsil, L.L.P.

(57) ABSTRACT

A method of forming a semiconductor device having a through-silicon via (TSV) is provided. A semiconductor device is provided having a first dielectric layer formed thereon. One or more dielectric layers are formed over the first dielectric layer, such that each of the dielectric layers have a stacking structure, wherein the stacking structures in the one or more dielectric layers are vertically aligned. The stacking structures may be, for example, metal rings. The stacking structures are then removed to form a first recess. A second recess is formed by extending the first recess into the substrate. The second recess is filled with a conductive material to form the TSV.

20 Claims, 16 Drawing Sheets

METHOD OF FORMING THROUGH-SILICON VIAS

TECHNICAL FIELD

The present invention relates generally to integrated circuit fabrication and, more particularly, to a method of forming through-silicon vias in a semiconductor die and the resulting stacked dice structure.

BACKGROUND

Since the invention of the integrated circuit (IC), the semiconductor industry has experienced continued rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) integrated circuits have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on through-silicon vias (TSVs). Generally, TSVs are formed by etching a vertical via through a substrate and filling the via with a conductive material, such as copper. The TSVs may be used to provide an electrical contact on a backside of the semiconductor substrate to semiconductor circuitry on an opposing side of the substrate, or to provide an electrical contact to semiconductor circuitry on a stacked die. In this manner, dies may be stacked while maintaining a smaller package size.

Generally, the process used to form a TSV involves etching a trench at least partially through the silicon substrate and, possibly, the overlying dielectric layers, and then depositing copper in the trench. This method, however, requires a hard mask and etch module capability. Furthermore, due to the topography of the wafer, a copper residue may remain over the surface of the wafer.

As a result, there is a need for a more efficient method and system of forming TSVs.

SUMMARY OF THE INVENTION

These and other problems are generally solved or circumvented, and technical advantages are generally achieved, by embodiments of the present invention which provide for a semiconductor device having a through-silicon via (TSV).

In an embodiment, a method of forming a semiconductor device having a TSV is provided. A semiconductor substrate having the semiconductor device formed thereon is provided. A first dielectric layer is formed, and a first interconnect feature is formed in the first dielectric layer. A second dielectric layer is formed on the first dielectric layer, and a second interconnect feature is formed in the second dielectric layer. Also formed in the second dielectric layer is a stacking structure. Thereafter, the stacking structure is removed to form a first recess in the second dielectric layer. A second recess is formed by extending the first recess into at least a portion of the semiconductor substrate. The second recess is filled with a conductive material.

In another embodiment, another method of forming a semiconductor device having a TSV is provided. A substrate is provided and a first dielectric layer is formed over the substrate. One or more second dielectric layers are formed over the first dielectric layer, wherein the one or more second dielectric layers have a sacrificial stacking structure extending through the one or more second dielectric layers. The sacrificial stacking structures are removed, forming a first opening and exposing the first dielectric layer through the one or more second dielectric layers. The first dielectric layer exposed in the first opening is removed, thereby exposing a portion of the substrate. A portion of the exposed substrate is removed to form a recess in the substrate. The recess is filled with a conductive material.

In yet another embodiment, a method of forming a semiconductor device having a TSV is provided. A substrate is provided and a plurality of dielectric layers is formed thereon. A stacking structure is formed in one or more of the plurality of dielectric layers. The stacking structure is removed, forming a recess extending through the one or more of the plurality of dielectric layers. The recess is extended into the substrate and filled with a conductive material.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
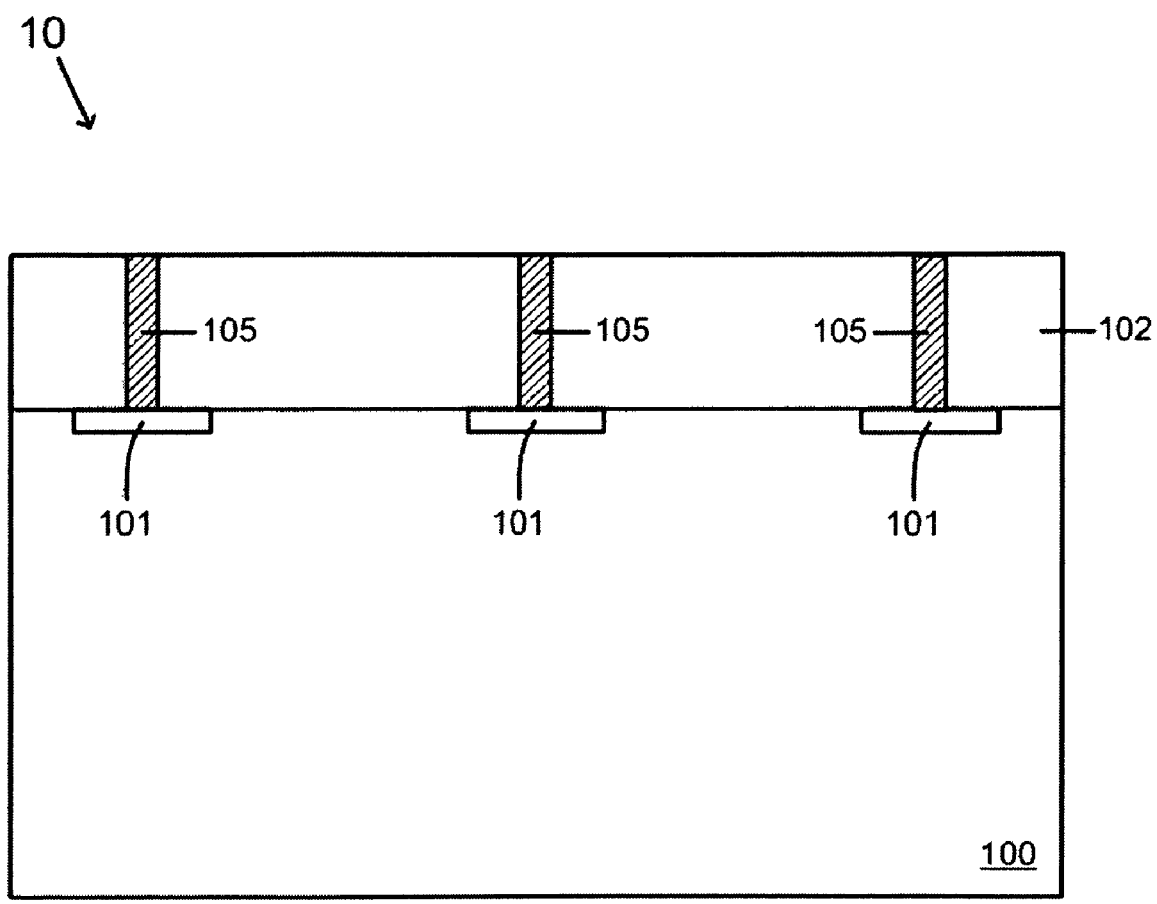
FIGS. 1-10 are cross-sectional views of a wafer having through-silicon vias formed in the substrate and dielectric layers according to an illustrative embodiment.

With reference now to FIG. 1, there is shown a cross-sectional diagram of wafer 10. Wafer 10 comprises semiconductor substrate 100, which is typically silicon (Si), but may also be made of gallium arsenide (GaAs), gallium arsenide-phosphide (GaAsP), indium phosphide (InP), gallium aluminum arsenic (GaAlAs), indium gallium phosphide (InGaP), and the like, and illustrates devices 101 formed in the substrate 100. While only three devices 101 are shown, there may be many active and passive semiconductor devices 101 formed in substrate 100.

Insulating layer (also sometimes referred to as an inter-layer dielectric layer) 102 is deposited on substrate 100 of wafer 10. In an embodiment, materials used to form ILD layer 102 include silicon dioxide ($SiO_2$) and phosphosilicate glass (PSG). In another embodiment, ILD layer 102 comprises a low dielectric constant (low-k) material, such as a carbon-doped silicon oxide or fluorine-doped silicate glass (FSG) layer, although other low-k dielectric materials may also be used for ILD layer 102. A photolithography process may be used to pattern ILD layer 102, defining the electrical connections (contacts) 105 to the devices 101 previously formed in semiconductor substrate 100. An etch process, such as an anisotropic dry etch process, can be performed after the lithography to form contact openings in ILD layer 102. Afterward, electrical contacts 105 to devices 101 may be formed by filling conductive materials in the contact openings by a metallization process, such as a metal chemical vapor deposition (CVD) process. Conductive materials used to form contacts 105 include aluminum (AL), copper (Cu), tungsten (W), cobalt (Co), other metal or metal alloy, although other suitable conductive materials or processes may also be used to form contacts 105. A planarization process, such as a chemical mechanical polishing (CMP), may then be performed on the substrate surface to remove the excess contact materials, providing a substantially flat substrate surface preferable for the subsequent processing steps. In an embodiment, a barrier layer, such as a titanium nitride (TiN) layer (not shown), may be formed by a suitable process on the bottom of the contact openings prior to the formation of contact 105. A barrier layer may prevent any metals deposited in the metallization process from leaching into substrate 100.

Figure 2A:
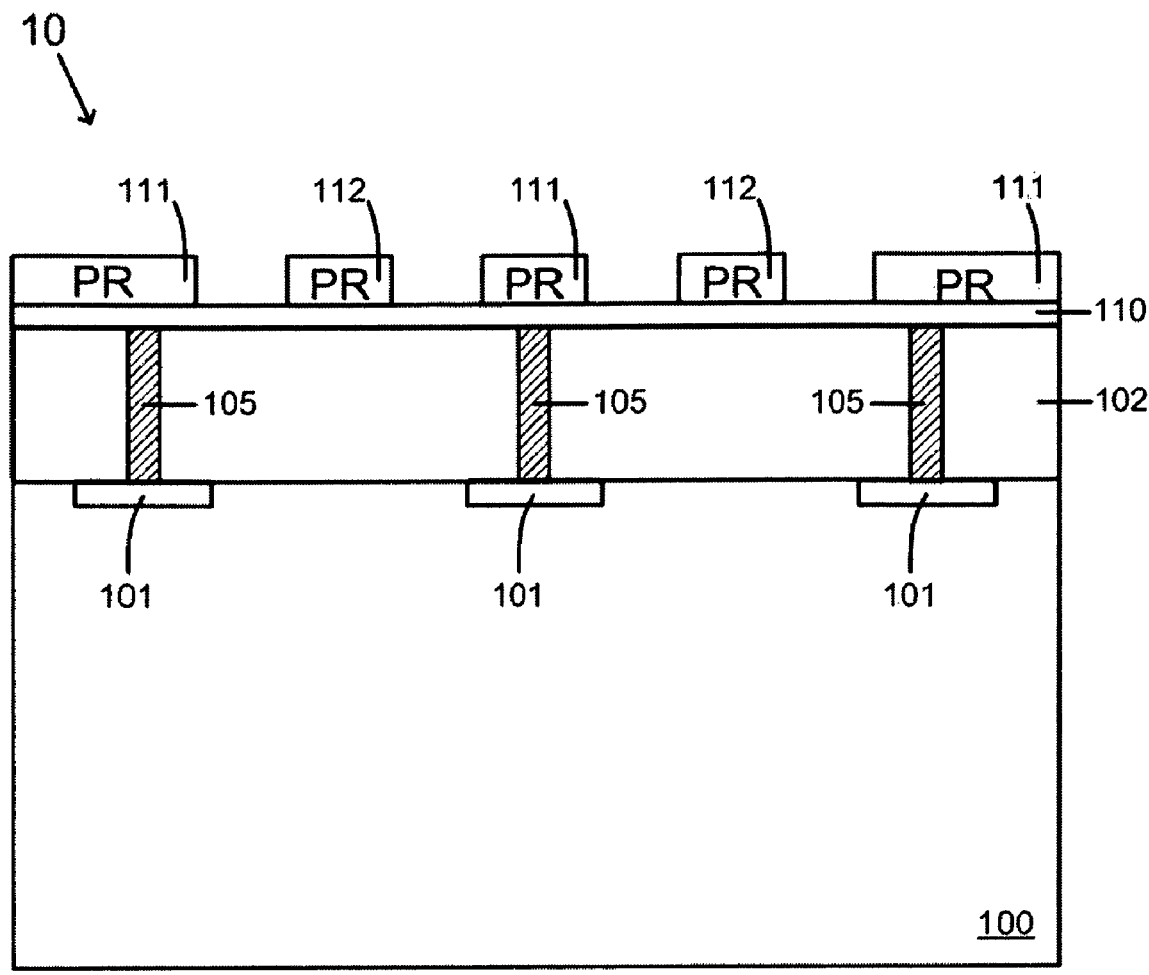
Figure 2B:
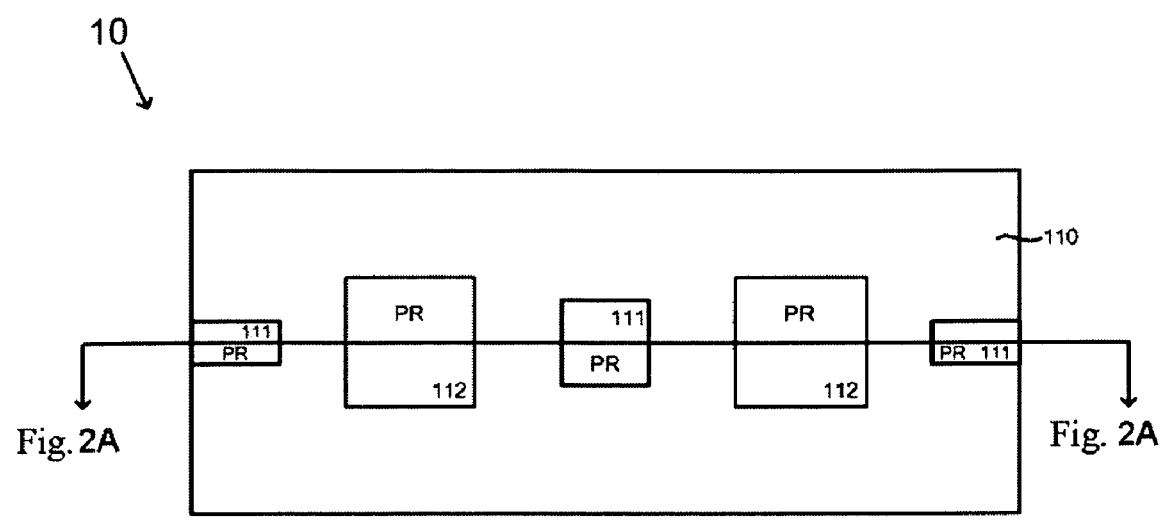
Figure 2C:
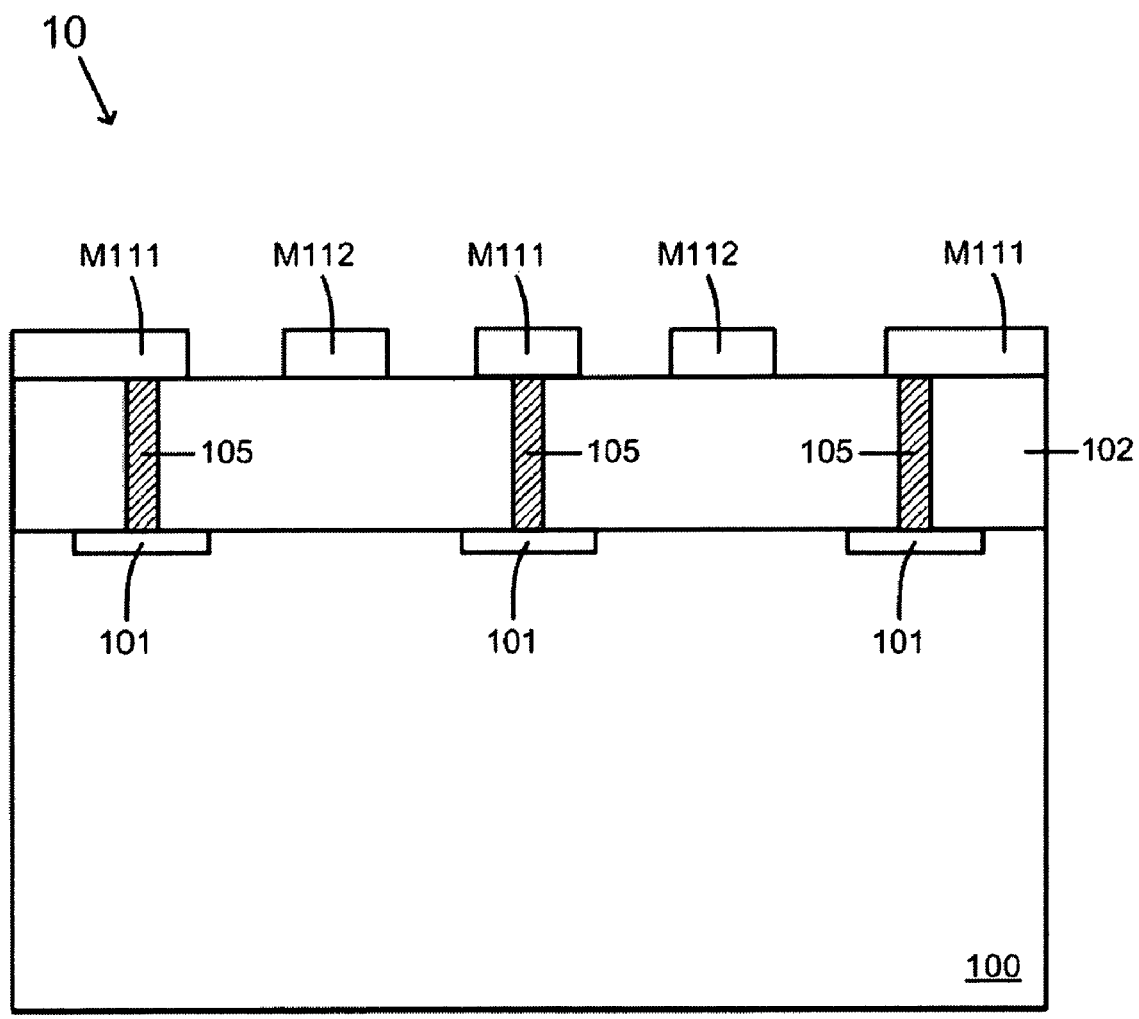

As illustrated in FIGS. 2a-2c, a first interconnect metal layer (also sometimes referred as M1 layer) 110 is formed atop the planarized substrate from previous processing steps. The first interconnect metal layer 110 may comprise various conducting materials, such as copper, tungsten, aluminum, gold, silver, and the like, formed through a process such as CVD. The first interconnect metal layer 110 is subsequently patterned using photolithography processes known in the art in accordance with an embodiment of the present invention. In an embodiment, the photolithography process involves depositing a photoresist material (indicated as PR in FIGS. 2a and 2b) and irradiating the photoresist material in accordance with a pre-determined pattern. Thereafter, the photoresist material may be developed to expose portions of the underlying M1 layer to be removed in a subsequent etching step, while the remaining photoresist material protects the desired portions of the M1 layer during the etching process. In an embodiment, the pattern registered in the photoresist material in the current photolithography process includes photoresist pattern 111 that defines the M1 features typically used to provide electrical connections among the various semiconductor devices 101 formed in substrate 100 or electrical connections between a device 101 in substrate 100 and conductive features in an overlying interconnect layer. It is noted, however, that the pattern registered in the photoresist material in the current photolithography process also includes photoresist pattern 112 that defines the portions of the substrate surface to be used for forming through-silicon vias in substrate 100 in subsequent processing steps. The processing steps of forming through-silicon vias in the substrate area defined by photoresist pattern 112 will be discussed in detail below.

An etching process, such as an anisotropic plasma etching process, is subsequently performed on wafer 10, removing the exposed portions of the first interconnect metal layer 110. As a result, the M1 features left in the first interconnect metal layer include metal traces M111 defined by photoresist pattern 111, and metal plates M112 defined by photoresist pattern 112 as illustrated in FIG. 2c. It should be noted that the embodiment illustrated in FIGS. 2a-2c illustrates square photoresist patterns 112 for illustrative purposes only. Other embodiments may use any suitable shape for photoresist patterns 112, including rectangles, circles, ovals, triangles, polygon shapes, and/or the like. Furthermore, a metal plate M112 may be formed on the substrate surface wherever a through via is to be formed in its underlying substrate area in accordance with a pre-determined through via arrangement, not limited to any specific substrate surface area.

Figure 3A:
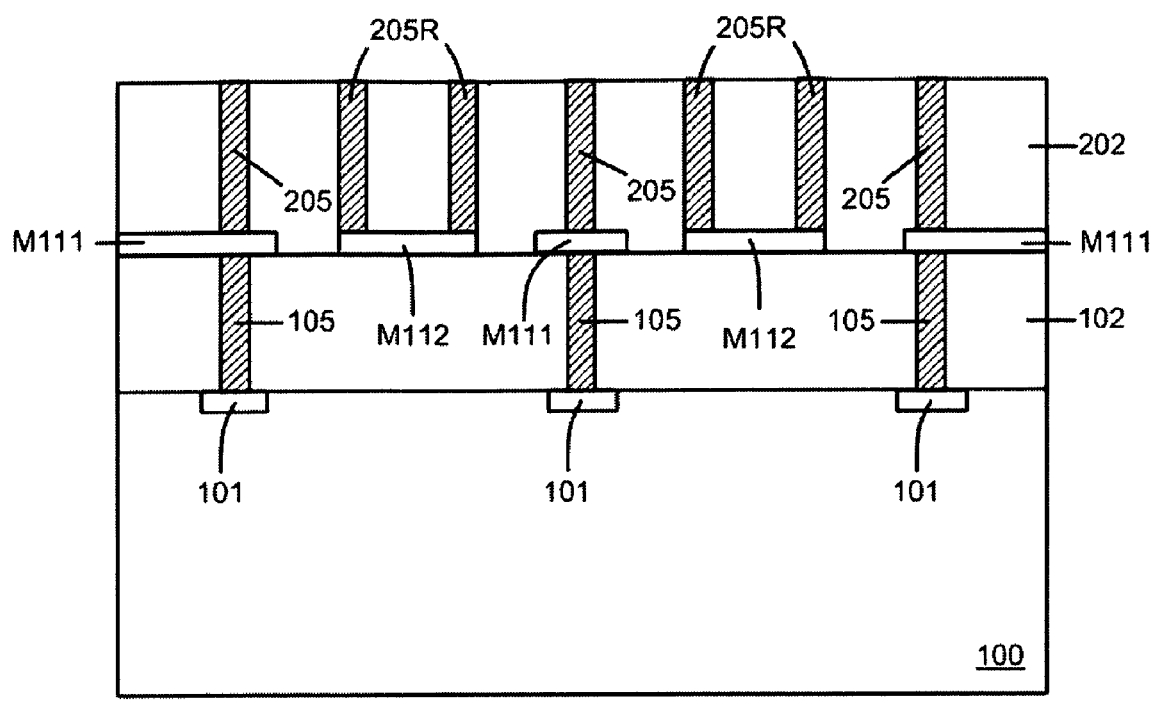
Figure 3B:
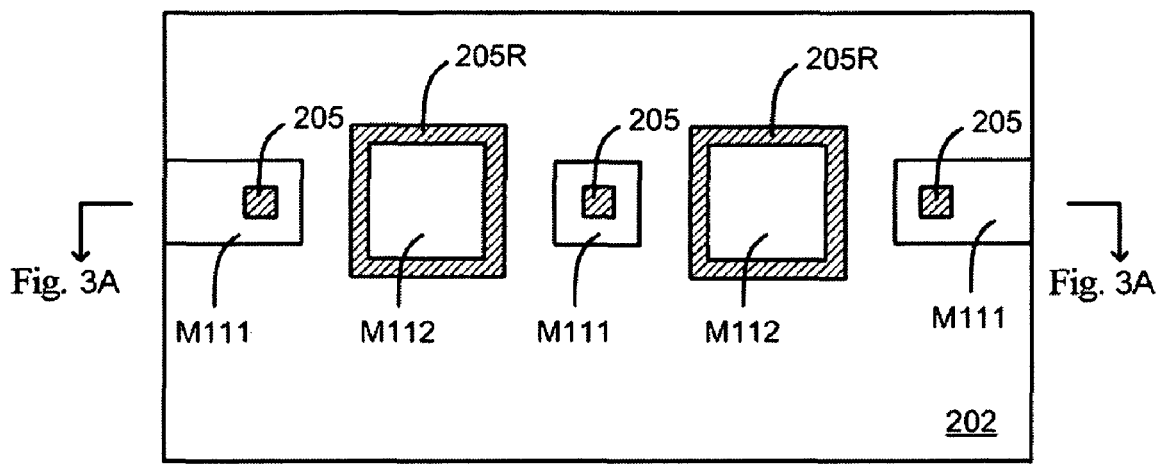

FIGS. 3a and 3b illustrate forming a first inter-metal dielectric (IMD) layer 202 over substrate 100 in accordance with an embodiment of the present invention. In an embodiment, low-k materials, such as a carbon-doped silicon oxide or FSG layer, are used to form the first IMD layer 202, although other suitable dielectric materials, such as silicon dioxide ($SiO_2$) and phosphosilicate glass (PSG) may be also used. A photolithography and etch process flow may be performed to form via openings in the first IMD layer 202. Afterward, a metal deposition process, such as a CVD process, may be performed to fill conductive materials, such as Al, Cu, W, Co, or other suitable conductive materials, in the via openings to form vias in the first IMD layer 202, making electrical connections to the metal traces M111 and metal plates M112 in the first interconnect layer. Similarly, a CMP process may then be performed on the substrate to provide the desired flat substrate surface for the subsequent processing steps. Vias thus formed in the first IMD layer 202 include vias 205 coupled to the metal traces M111 and via rings 205R (FIG. 3b) coupled to the metal plates M112, overlying and substantially aligned with the edges of metal plates M112.

It should be noted that the vias 205 connected to the underlying metal traces M111 in FIGS. 3a and 3b are shown as a single via for illustrative purposes only. Other embodiments may use other via configurations, such as an array of vias 205 for making an electrical connection to a metal trace M111, for the purpose of, for example, increasing conductivity. Also, the via rings 205R in FIGS. 3a and 3b are shown as square via rings for illustrative purposes only. Other embodiments may have different via ring shapes that preferably match the periphery of the underlying metal plates M112, such as rectangles, circles, ovals, triangles, polygon shapes, and/or the like. A via ring 205R is not limited to any specific shape, but preferably, is a closed ring substantially aligned with the edge of an underlying metal plate M112. In an embodiment, the width of a via ring 205R is similar to that of a via 205.

Figure 4:
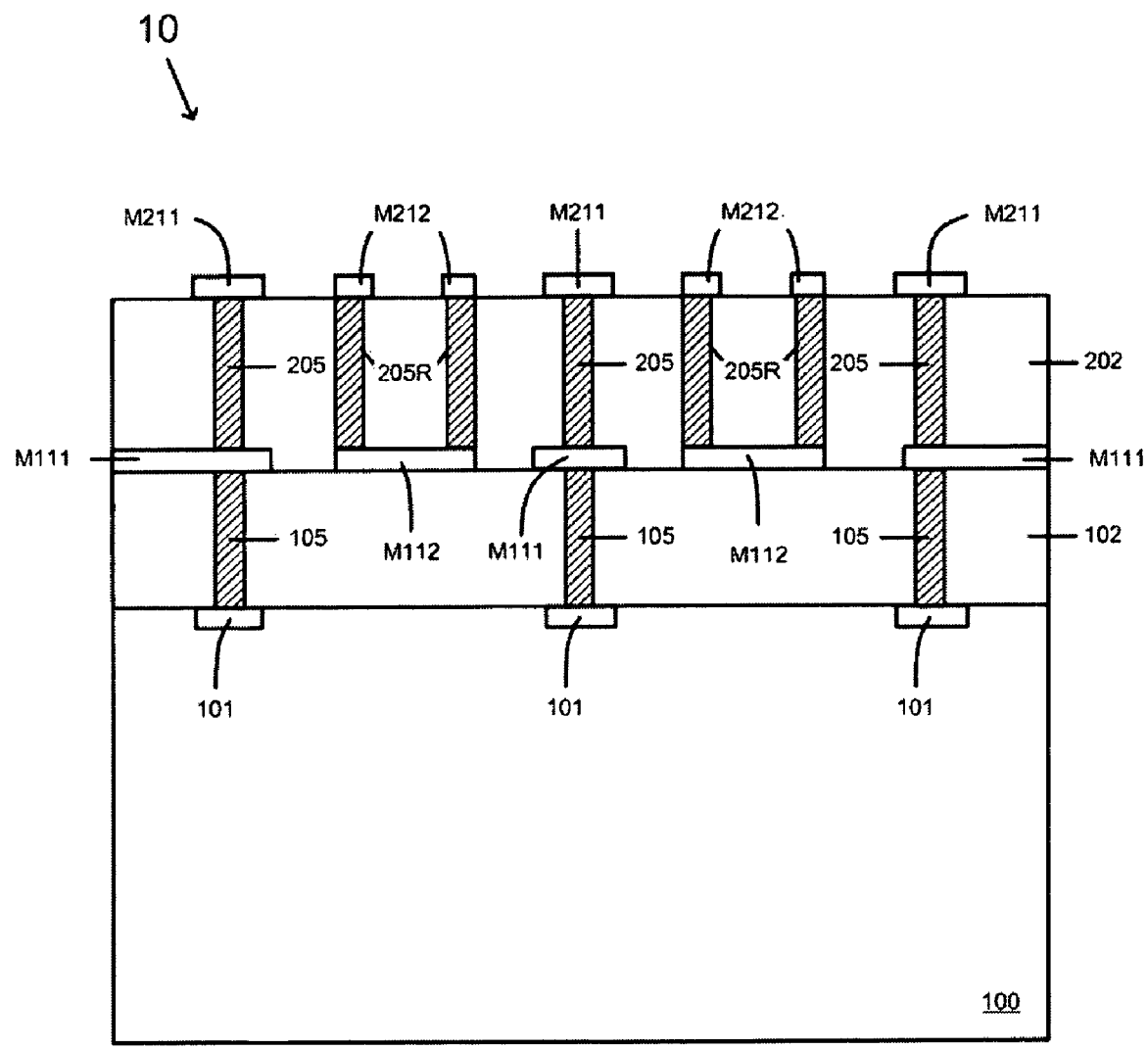

FIG. 4 illustrates forming conductive features in an overlying second interconnect metal layer (also sometimes referred to as M2 layer) in an embodiment. Materials and processes known in the art, such as those used to form metal traces M111 and metal plates M112 in the first interconnect layer, may be used. Metal traces M211 may be formed overlying vias 205 and electrically coupled to vias 205. Metal features M212 are formed stacking on via rings 205R. In an embodiment, metal features M212 have a ring shape, and the outer edge of a metal feature M212 is substantially aligned with the outer edge of an underlying via ring 205R. In other embodiments, metal features M212 are plates with their edges substantially aligned with the outer edges of underlying via rings 205R.

Figure 5:
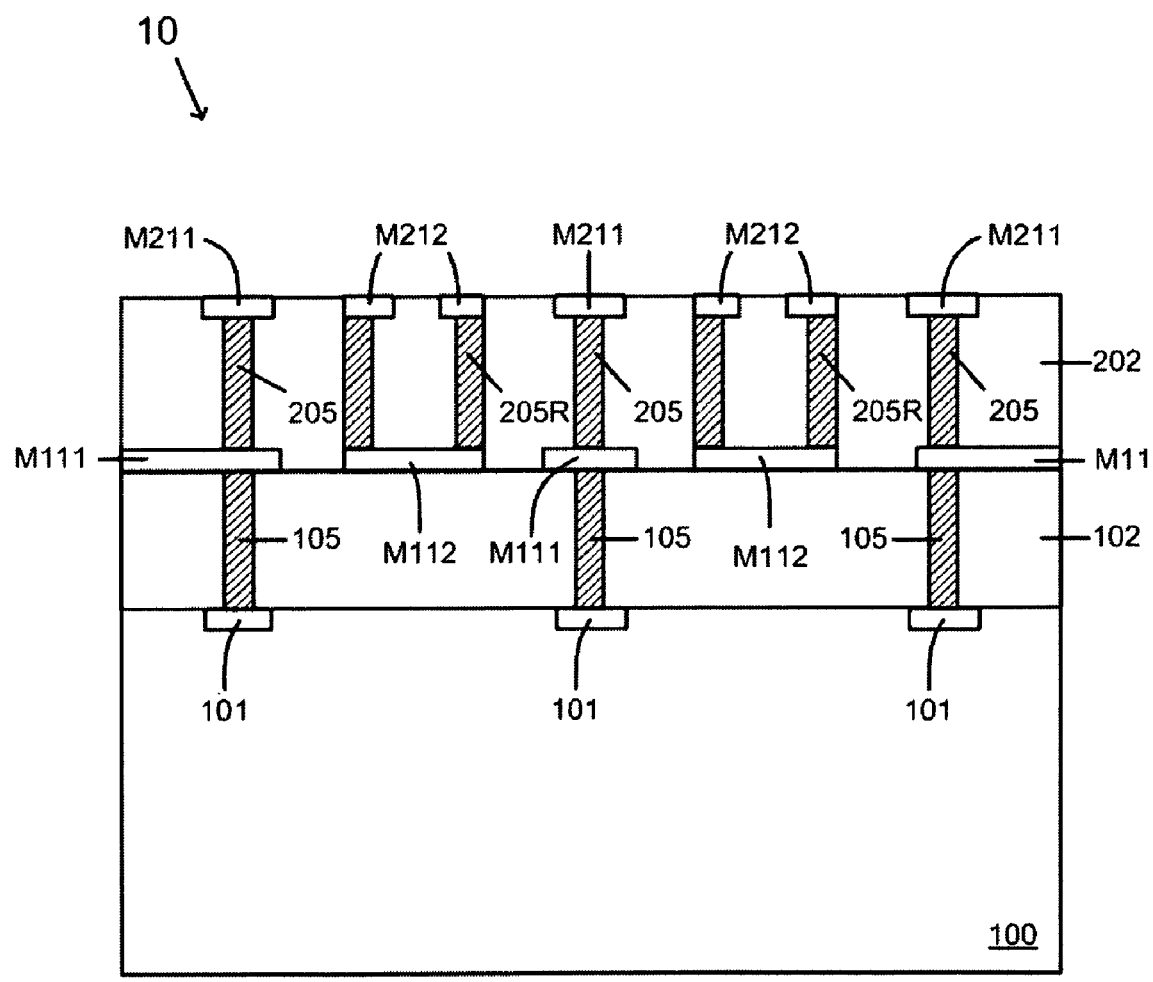

FIG. 5 illustrates another embodiment, where a dual-damascene process flow known in the art may be performed to form M211, M212, via 205, and via rings 205R in the first IMD layer 202, simultaneously. When a dual-damascene process is used, the first IMD layer 202 is preferably a low-k material, such as a carbon-doped silicon oxide or FSG layer, although other suitable dielectric materials may also be used. Also, copper is preferably used to form M211, M212, via 205, and via rings 205R, although other suitable conductive materials may also be used.

Figure 6:
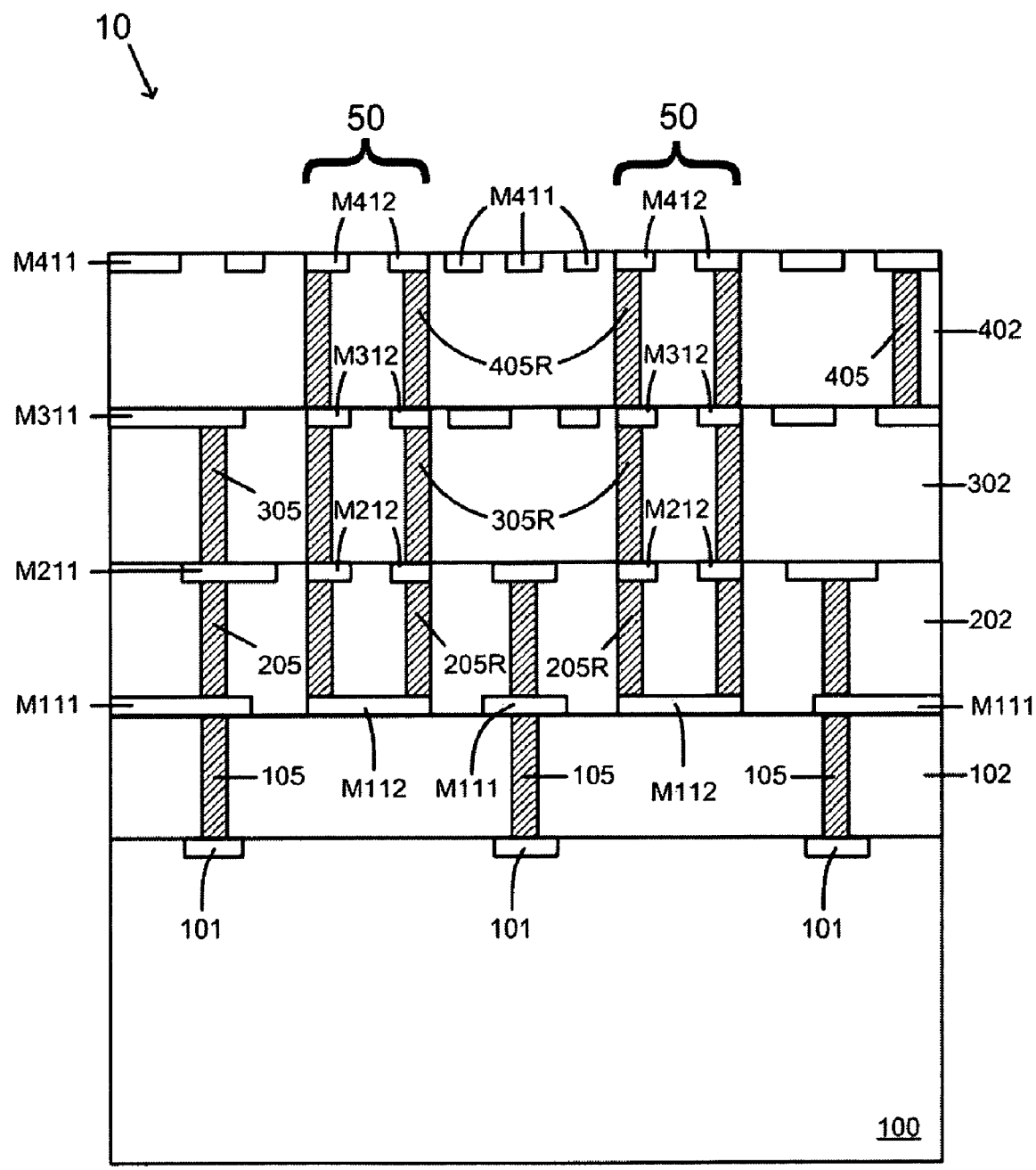

In FIG. 6, it is shown that similar processing steps may be repeated to form vias 305, via rings 305R, metal traces M311, and metal features M312 in a second IMD layer 302, and vias 405, via rings 405R, metal traces M411, and metal features M412 in a third IMD layer 402. Metal features M412, M312, M212, and M112 overlie each other and are coupled through via rings 405R, 305R, and 205R, respectively. In an embodiment, the outer edges of metal features M412, M312, M212, and M112 and via rings 405R, 305R, and 205R are substantially aligned. Although only four interconnect metal layers are shown in FIG. 6, it is understood that similar metal features can be formed in the upper interconnect metal layers as well until the uppermost interconnect metal layer. Therefore, M411 and M412 in FIG. 6 may also indicate similar metal traces and features formed in upper interconnect metal layers. Up to this point, stacking structures 50 are formed in the interconnect layers of wafer 10, under which through-silicon vias are to be formed in substrate 100, as mentioned previously.

Figure 7:
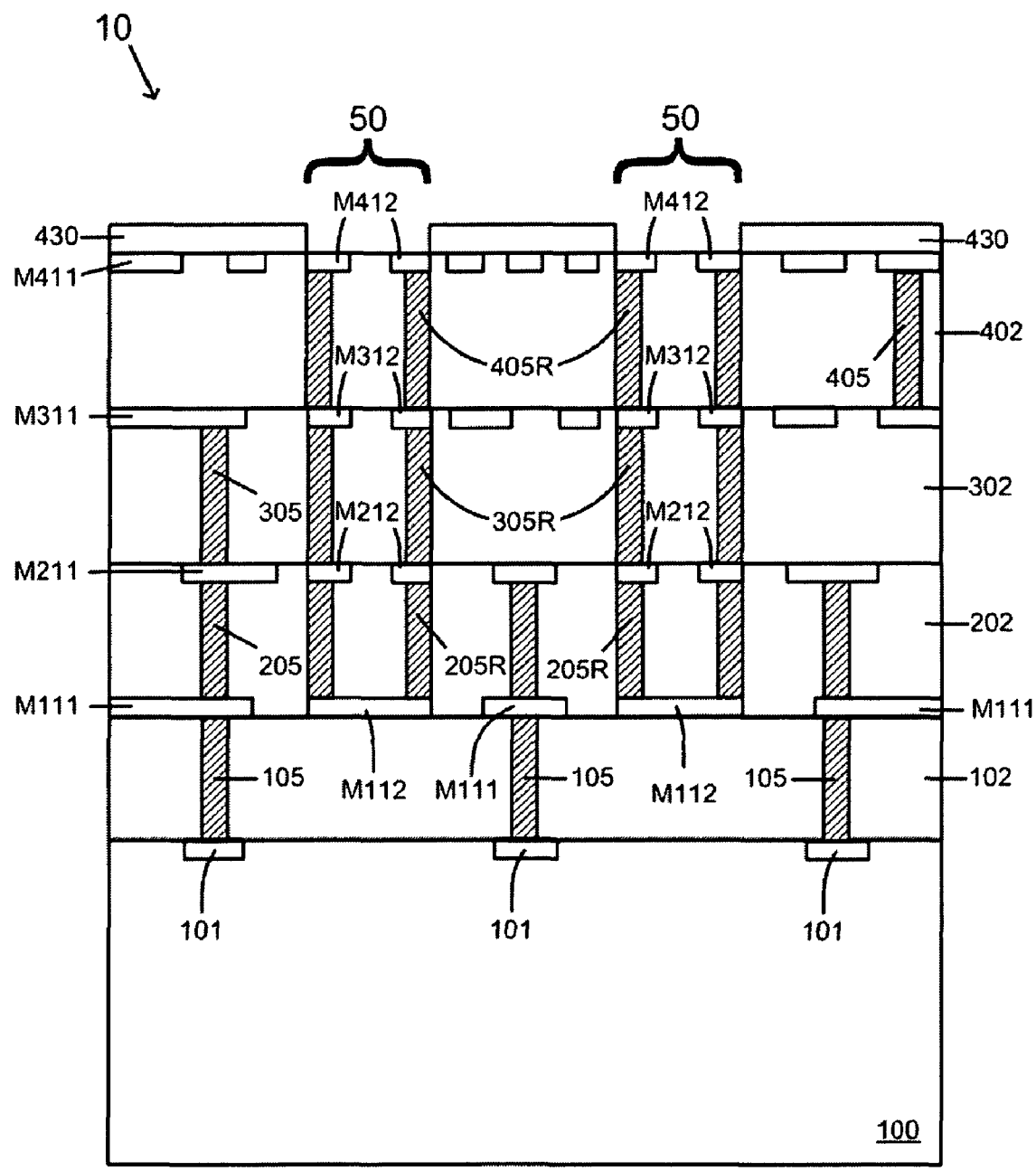

Illustrated in FIG. 7, a mask layer is formed on wafer 10. The mask layer is patterned and etched using photolithography and etch processes known in the art to form a patterned mask layer 430, forming openings exposing the wafer surface regions of stacking structures 50. In an embodiment, these exposed wafer surface regions are also commonly referred to as TSV regions because TSVs are to be formed in the substrate 100 under these regions in subsequent processing steps. The patterned mask layer 430 is preferably a hard mask layer comprising a dielectric material, such as silicon nitride (SiNx) or silicon dioxide (SiO$_2$), in a single or multiple-layer configuration, although other suitable organic or inorganic hard mask materials may also be used. Alternatively, a patterned photoresist may also be used to form patterned mask layer 430. In an embodiment where silicon nitride is used for the patterned mask layer 430, it preferably has a thickness of about 50 μm to about 500 μm.

Figure 8A:
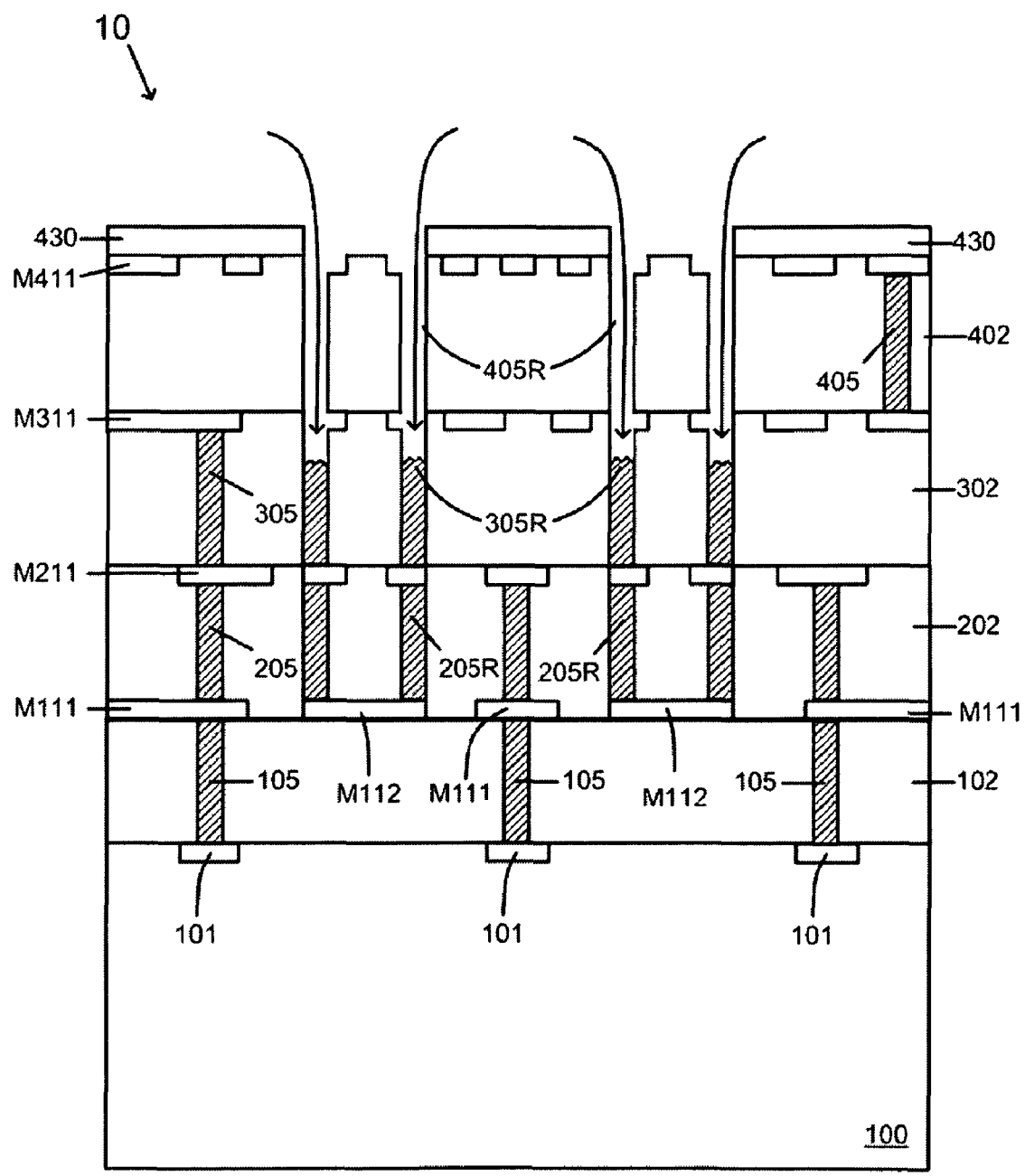
Figure 8B:
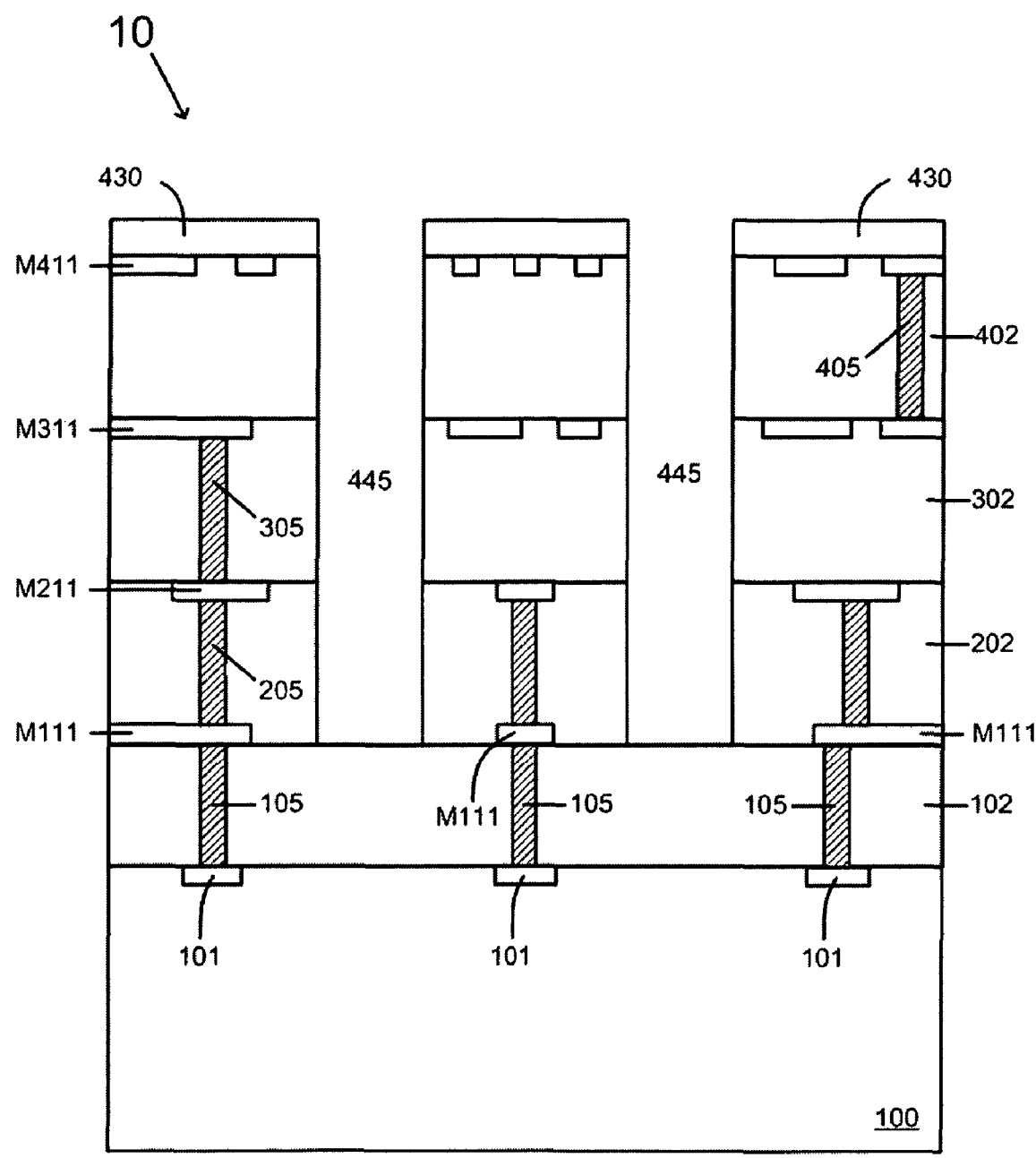

As illustrated in FIGS. 8a and 8b, the stacking structures 50, e.g., a sacrificial stacking structure, are subsequently lifted off and removed from the wafer 10 in accordance with an embodiment of the present invention. The stacking structures 50 on wafer 10 may be removed by a first wet chemical etch process. In this embodiment, a sulfuric acid and hydrogen peroxide solution of about 30° C. to about 60° C. may be used to etch the copper from the stacking structures 50 because the sulfuric acid has a high etch selectivity rate of copper to the IMD layers and the ILD layer. The first wet chemical etch process on the stacking structures 50 starts from the top-most metal features M412 and proceeds into wafer 10 along the via rings and the bottom metal plates M112 (indicated by arrows in FIG. 8a), until copper used to form the stacking structures 50 is substantially removed. A rinse process may follow to lift off the IMD materials left from the copper etch of stacking structures 50, creating recesses 445 in the IMD layers as illustrated in FIG. 8b.

Figure 9:
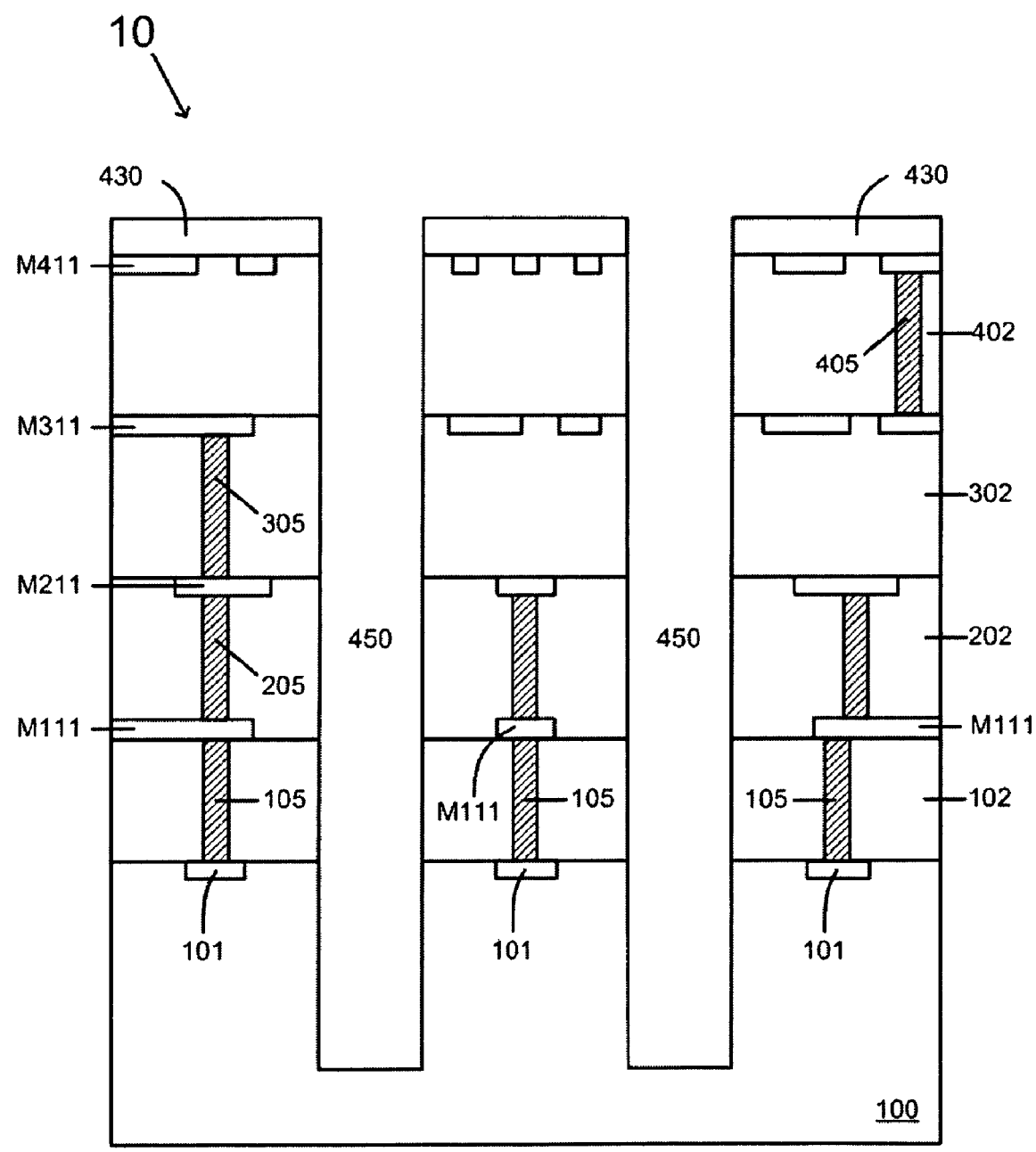

In FIG. 9, wafer 10 is processed with a second etch process to remove ILD layer 102 at the bottoms of recesses 445. In an embodiment, ILD layer 102 comprises low-k dielectric material and may be removed by an anisotropic etch process known in the art, which has a high etch selectivity rate of low-k material to the semiconductor substrate 100. Afterwards, wafer 10 is processed with a third etch process in the recesses created from previous processing steps in order to remove the substrate 100 material, e.g., silicon, and extend the recesses into the substrate 100. In an embodiment, a time-controlling anisotropic plasma etch process is conducted on wafer 10 to create deep TSV recesses 450 having a depth of about 2-75 microns in substrate 100. In another embodiment, an anisotropic plasma etch process creates an etch pattern in substrate 100, which reaches a depth greater than half of the substrate 100 thickness, as shown in FIG. 9.

Figure 10:
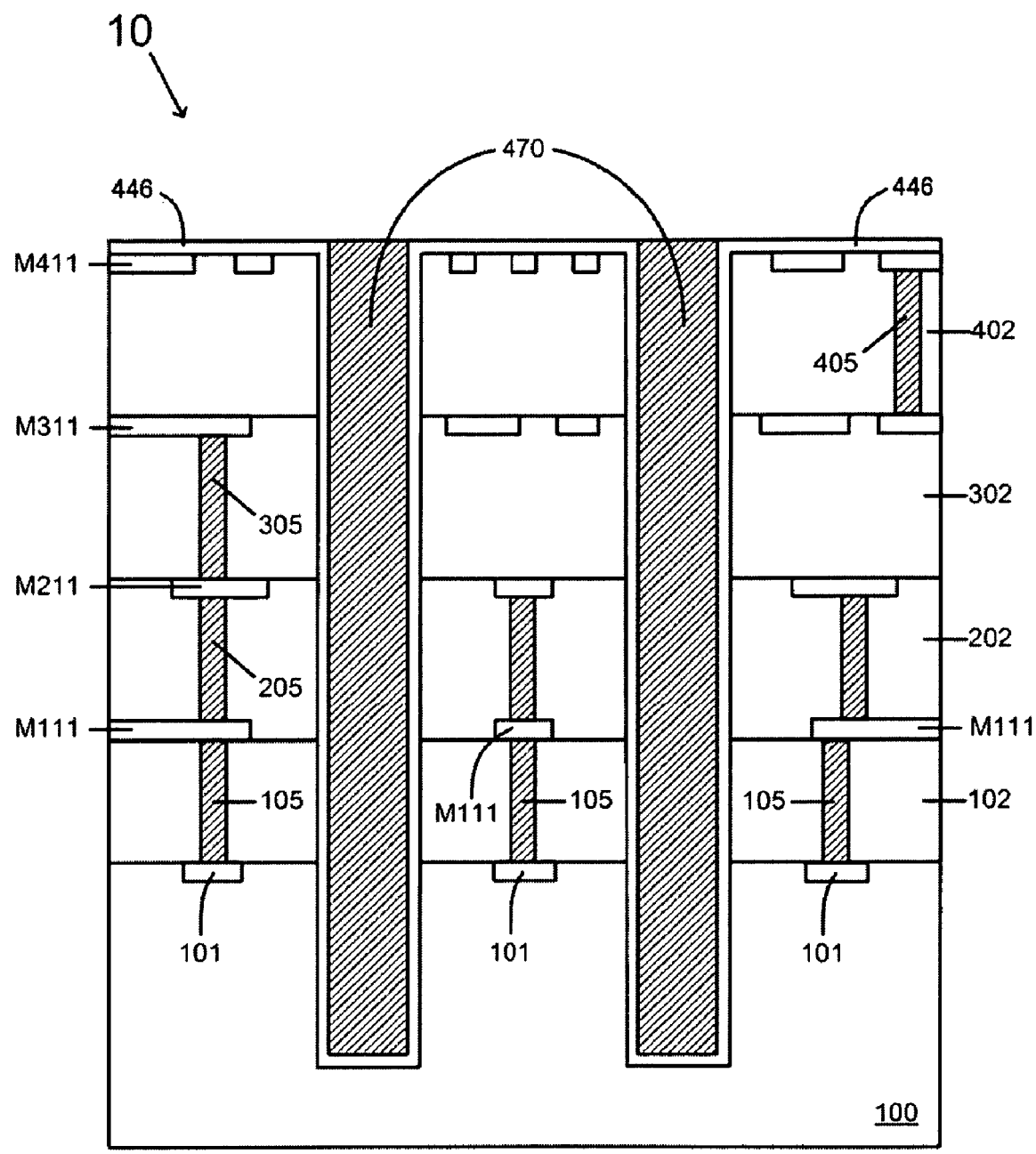

Illustrated in FIG. 10, patterned mask layer 430 is removed with a known process and isolation layer 446 is deposited over wafer 10, including TSV recesses 450. Isolation layer 446 in TSV recesses 450 may prevent any conducting material from leaching into any active portions of the circuitry of wafer 10. In an embodiment, PSG, undoped silicate glass (USG), or silicon nitride is deposited through a plasma enhanced chemical vapor deposition (PECVD) to form isolation layer 446, although other suitable materials and processes may also be used.

A metallization process, such as Cu plating, may be subsequently performed on wafer 10, filling copper (Cu) in the TSV recesses to form TSVs 470 in wafer 10. Other suitable conductive materials, such as aluminum (Al), copper (Cu), tungsten (W), cobalt (Co), gold (Au), silver (Ag), and other suitable deposition processes, such as a metal CVD process, may also be used to form TSVs 470. Similarly, a CMP process may be performed afterwards on the substrate to provide the desired flat substrate surface for the subsequent processing steps. Alternatively, a barrier layer, such as a titanium nitride (TiN) layer and/or a metal seed layer (not shown), may be formed conformally in the TSV recesses 450 by suitable processes, such as CVD or physical vapor deposition (PVD), prior to the metallization process of forming TSVs 470.

In an embodiment, wafer 10 processed through the processing steps described above may be bonded to other semiconductor integrated circuit dice or wafers through a typical back-end-of-line (BEOL) process flow used in forming stacked-dice configuration.

Figure 11:
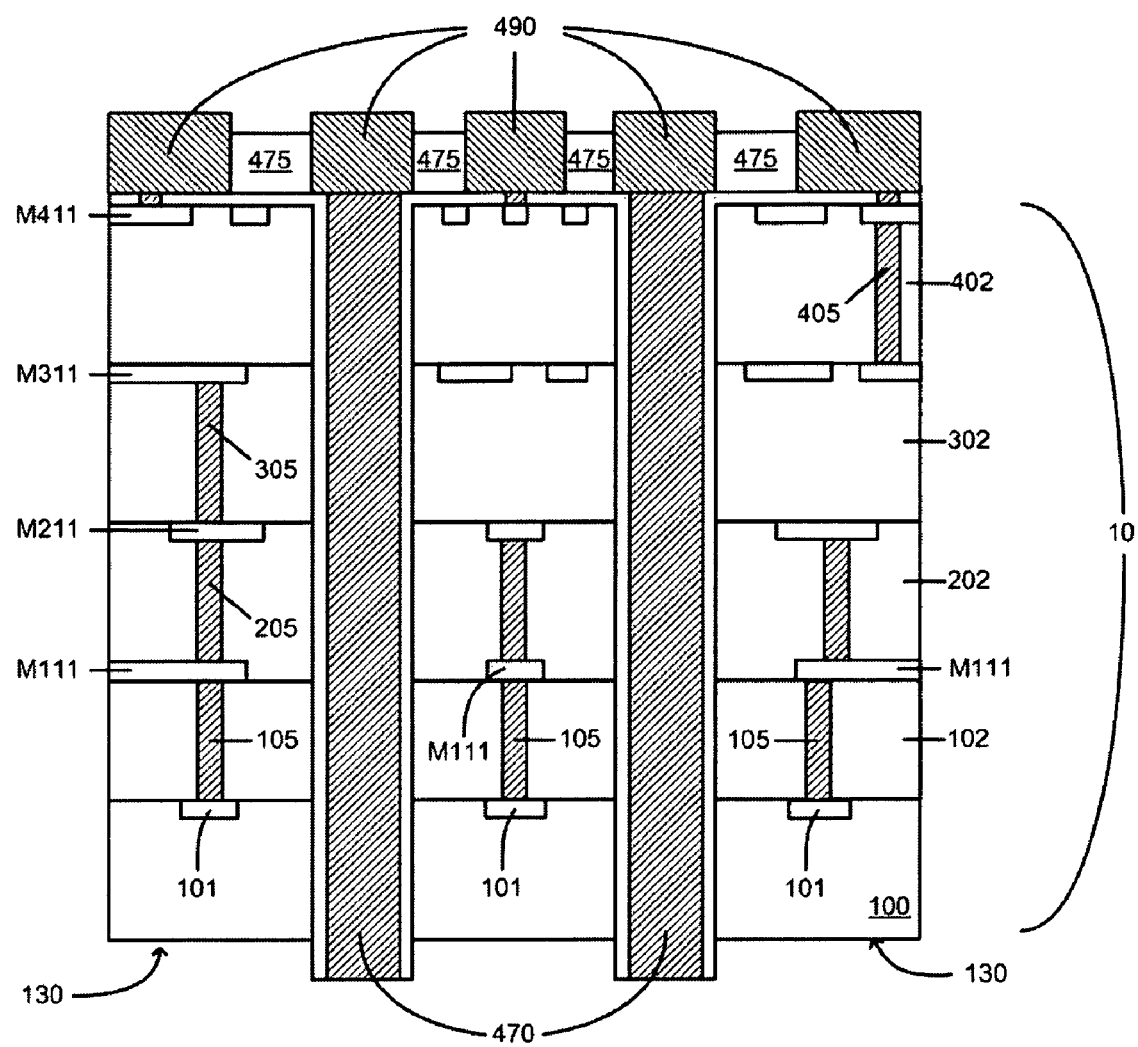
FIG. 11 illustrates forming bonding contacts on a wafer having through-silicon vias according to an illustrative embodiment.

In FIG. 11, bonding contacts 490 are formed by depositing dielectric layer 475, which insulates devices and interconnect traces in wafer 10 from any other circuitry or devices in any wafers bonded to wafer 10. Recesses are etched into dielectric layer 475 into which a conducting material is deposited to form bonding contacts 490. Bonding contacts 490 are electrically coupled to the metal traces M411 and TSVs 470 in wafer 10. The insulation material making up dielectric layer 475 is preferably removed or etched to reveal bonding contacts 490 slightly elevated above the top of dielectric layer 475. Also, substrate 100 is thinned from a back-side 130 through known techniques, such as back grinding, etching, CMP, or the like, and portions of substrate 100 are removed to reveal contact points with TSVs 470. The elevated portion of TSVs 470 over the back-side 130 of substrate 100 may facilitate bonding wafer 10 to another integrated circuit wafer or die.

Alternatively, bonding contacts similar to bonding contacts 490 may also be formed on the back-side 130 (the thinned side) of wafer 10 in a similar manner as described above. Bonding contacts thus formed (not shown) are electrically coupled to the TSVs 470 from the back-side 130 of wafer 10 and may be used to bond wafer 10 to another integrated circuit wafer or die.

Figure 12:
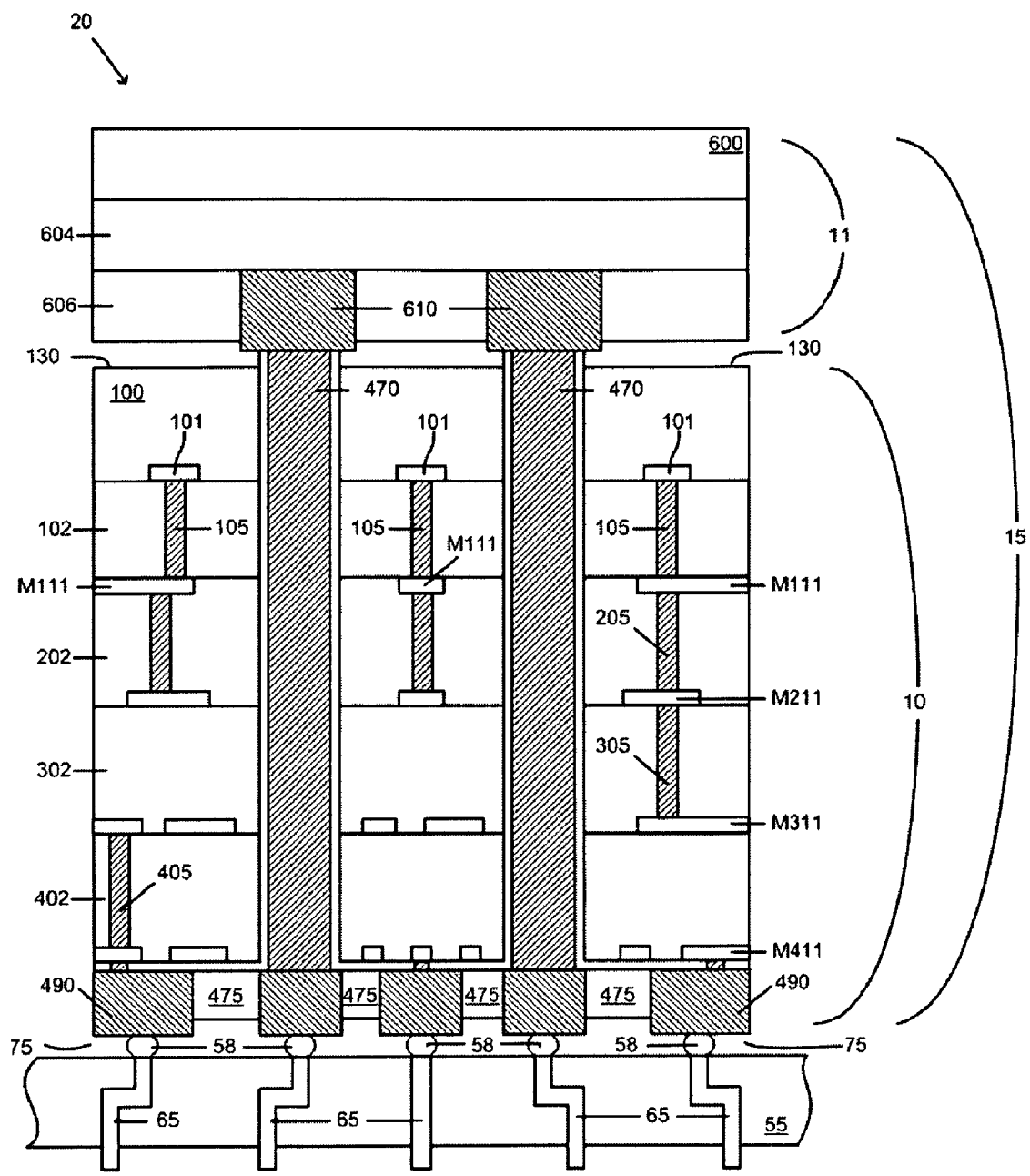
FIG. 12 is a cross-sectional view illustrating a stacked wafer configuration according to an illustrative embodiment.

FIG. 12 illustrates one embodiment in the current invention, where wafer 10 is bonded to wafer 11 to form stacked-dice structure 15. Wafer 11 comprises substrate 600, dielectric layer 604, insulating layer 606, and bonding contacts 610. Substrate 600 may comprise one or more pre-formed semiconductor devices, dielectric layer 604 may be used to isolate interconnect traces formed in different interconnect layers, and insulating layer 606 may be used to embed bonding contacts 610 and limit interference between the various devices in either wafer. Wafers 10 and 11 are aligned and bonded together at bonding pads 610 and the elevated contact points of TSVs 470. In an embodiment, a bonding medium, such as copper, tungsten, a copper-tin alloy, a gold-tin alloy, an indium-gold alloy, a lead-tin alloy, or the like, is applied between the bonding contacts on the to-be-bonded wafers 10 and 11.

It should be noted that, although wafers 10 and 11 are illustrated to form a stacked wafer configuration, the specific wafers used herein are not intended to limit the embodiments of the present invention in any way. In practice, structures 10 and 11 may be either a wafer or a die, thus the stacked structure may have a die-to-die bonding configuration, a die-to-wafer bonding configuration, or a wafer-to-wafer bonding configuration.

It should also be noted that any number of different devices, components, connectors, and the like may be integrated into wafers 10 and 11. The specific devices or lack of devices that may be illustrated herein are not intended to limit the embodiments of the present invention in any way.

FIG. 12 also illustrates that the stacked-dice structure 15 is attached to a package substrate 55 to form IC package 20 in a flip-chip ball grid array (BGA) configuration. After the formation of stacked dice structure 15, a large number of bonding contacts, such as bonding contacts 490 are disposed on a bonding surface 75, generally arranged in an array form. Bonding surface 75 is attached to package substrate 55 through solder bumps (e.g., solder balls) 58, which in turn makes an electrical connection to a printed circuit board (not shown) through package leads 65. It is noted that other IC packaging schemes may also be used to package stacked dice 15 in the embodiments. As another example, the stacked dice may be solder-bonded directly to a printed circuit board. The specific devices or lack of devices that may be illustrated herein are not intended to limit the embodiments of the present invention in any way.

It should be noted that only a limited number of active devices, such as devices 101, and vias, such as vias 105, 205 and 305, and TSVs 470, are shown for the ease of illustration and clarity. However, those of ordinary skill in the art will appreciate that, in practice, the integrated circuitry associated with integrated circuits and stacked dice may include millions or even tens of millions or more active and passive devices and, further, that interconnect structures may include tens or even hundreds of conductors or more in the uppermost dielectric layers. Similarly, those of ordinary skill in the art will appreciate that each stacked die will, in practice, include dozens or more back-side connections, such as bonding contacts or leads. Also, stacked die structures in the embodiments may include dozens or even hundreds or more of bonding contacts for making electrical connection to an IC package, for example, although only a number of bonding contacts 490 are shown.

It should also be noted that each of the example wafers and dice described and illustrated above are meant to provide alternative implementations of contacts, vias, TSVs, and bonding contacts that may be used with various embodiments of the present invention. In additional and/or alternative embodiments of the present invention, any combination of the illustrated options may be used. The illustrated embodiments are not intended to limit the implementation of the various additional and/or alternative embodiments of the present invention.

It should further be noted that the different layers described in the illustrated embodiments may comprise various different materials depending on the desired function or availability that the manufacturer determines. The metals used for the metalized bonding contacts may be any suitable metal or alloy, such as copper, tungsten, aluminum, aluminum-copper, and the like. Moreover, depending on the desired use or function of the different dielectric or insulating layers, any such dielectric material may be used, such as silicon dioxide, silicon nitride, USG, PSG, low-k dielectric material, and the like. The present invention is not limited to use with only a certain limited number of compounds and materials.

It should further be noted that the different layers and recesses in the illustrative embodiments may be deposited or created using any number of a variety of known processes. For example, creation of the various layers of oxides, dielectrics, or other layers may be accomplished through PVD, CVD, PECVD, atomic layer deposition (ALD), or the like. Moreover, removing material from the wafer may be accomplished through dry or wet etching, chemical mechanical polishing, or the like. The present invention is not limited to any single such method.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    providing a semiconductor substrate having the semiconductor device formed thereon;
    forming a first dielectric layer on the semiconductor substrate;
    forming a first interconnect feature in the first dielectric layer, the first interconnect feature being electrically coupled to the semiconductor device;
    forming a second dielectric layer on the first dielectric layer;
    forming a second interconnect feature in the second dielectric layer;
    forming a stacking structure in the second dielectric layer;
    removing the stacking structure, thereby forming a first recess in the second dielectric layer;
    forming a second recess by extending the first recess into at least a portion of the semiconductor substrate; and
    filling the second recess with a conductive material.

2. The method of claim 1, wherein the second dielectric layer comprises a plurality of dielectric layers, each of the plurality of dielectric layers having a stacking structure, the stacking structure of the plurality of dielectric layers being in direct contact with a stacking structure in an adjacent dielectric layer of the plurality of dielectric layers.

3. The method of claim 2, wherein the stacking structure comprises metal rings.

4. The method of claim 1, further comprising forming a metal region on the first dielectric layer prior to the forming the second dielectric layer, the stacking structure being located directly over the metal region.

5. The method of claim 1, wherein the forming the second interconnect feature in the second dielectric layer comprises forming a plurality of metal traces being electrically coupled to the semiconductor device.

6. The method of claim 1, wherein the forming the second recess is performed at least in part by a first etch process removing the first dielectric layer at a bottom of the first recess, followed by a second etch process etching the semiconductor substrate.

7. The method of claim 1, wherein the forming the second interconnect feature is performed simultaneously as the forming the stacking structure.

8. The method of claim 1, wherein the conductive material comprises copper, tungsten, aluminum, cobalt, gold, silver, or combinations thereof.

9. A method of forming a semiconductor device, the method comprising:
providing a substrate;
forming a first dielectric layer over the substrate;
forming one or more second dielectric layers over the first dielectric layer, the one or more second dielectric layers having a sacrificial stacking structure extending therethrough;
removing the sacrificial stacking structure, thereby forming a first opening through the one or more second dielectric layers and exposing a portion of the first dielectric layer;
removing the first dielectric layer along a bottom of the first opening, thereby forming a second opening through the first dielectric layer and exposing an exposed portion of the substrate;
removing a portion of the substrate along a bottom of the second opening, thereby forming a recess in the substrate; and
filling the recess with a conductive material.

10. The method of claim 9, wherein the sacrificial stacking structure comprises a stacking feature in each of the one or more second dielectric layers, each stacking feature comprising a first material, the first material having a different etch rate than material of the one or more second dielectric layers.

11. The method of claim 10, wherein the first material is a metal.

12. The method of claim 9, wherein the sacrificial stacking structure in each of the one or more second dielectric layers comprises a shape that completely separates a portion of the second dielectric layer from remaining portions of the second dielectric layer.

13. The method of claim 9, further comprising forming a bottom layer over the first dielectric layer, the bottom layer being in contact with a lowest sacrificial stacking structure.

14. The method of claim 13, wherein the forming the bottom layer is performed prior to the forming the one or more second dielectric layers.

15. A method of forming a semiconductor device, the method comprising:
providing a substrate;
forming a plurality of dielectric layers over the substrate;
forming a stacking structure in one or more of the plurality of dielectric layers, the stacking structure extending completely through at least one of the plurality of dielectric layers;
removing the stacking structure, thereby forming a recess extending through the one or more of the plurality of dielectric layers;
extending the recess into the substrate; and
filling the recess with a conductive material.

16. The method of claim 15, wherein an inter-layer dielectric (ILD) layer is interposed between the plurality of dielectric layers and the substrate.

17. The method of claim 16, wherein the extending the recess includes a first etching through the ILD layer and a second etching into the substrate.

18. The method of claim 15, wherein each stacking structure includes a metal and a dielectric.

19. The method of claim 15, wherein each stacking structure includes a metal shape surrounding another material in a plan view perspective.

20. The method of claim 15, wherein each stacking structure has a wider portion over a narrower portion.

* * * * *